(12) United States Patent
Cheng et al.

(10) Patent No.: US 8,037,586 B2
(45) Date of Patent: Oct. 18, 2011

(54) METHOD FOR FABRICATING BLIND VIA STRUCTURE OF SUBSTRATE

(75) Inventors: Wei-Ming Cheng, Kaohsiung (TW);
Shao-Wei Lin, Yunlin County (TW);
Pao-Chin Chen, Kaohsiung (TW)

(73) Assignee: Unimicron Technology Corp., Taoyuan (TW)

( * ) Notice: Subject to any disclaimer, the term of this patent is extended or adjusted under 35 U.S.C. 154(b) by 498 days.

(21) Appl. No.: 12/259,815

(22) Filed: Oct. 28, 2008

(65) Prior Publication Data

US 2010/0031502 A1 Feb. 11, 2010

(30) Foreign Application Priority Data

Aug. 7, 2008 (TW) .................................. 97130098 A

(51) Int. Cl.
*H01K 3/10* (2006.01)

(52) U.S. Cl. ................. 29/252; 29/830; 29/831; 29/832; 29/846

(58) Field of Classification Search .................... 29/852, 29/830, 831, 832, 846, 847; 156/630, 634, 156/644, 652; 427/282, 96; 174/250, 260, 174/255

See application file for complete search history.

(56) References Cited

U.S. PATENT DOCUMENTS

| | | | | |
|---|---|---|---|---|
| 5,352,325 A | * | 10/1994 | Kato | 216/18 |
| 5,841,075 A | * | 11/1998 | Hanson | 174/250 |
| 6,609,297 B1 | * | 8/2003 | Hiramatsu et al. | 29/852 |
| 6,766,576 B2 | * | 7/2004 | Haze et al. | 29/852 |
| 2004/0136152 A1 | | 7/2004 | Mitsuhashi et al. | |

FOREIGN PATENT DOCUMENTS

| | | |
|---|---|---|
| TW | 0469228 | 12/2001 |
| TW | 526690 | 4/2003 |
| TW | I237532 | 8/2005 |
| TW | 200614891 | 5/2006 |
| TW | I255523 | 5/2006 |
| TW | I260188 | 8/2006 |

OTHER PUBLICATIONS

"Office Action of Taiwan Counterpart Application", issued on Jun. 27, 2011, p. 1-p. 5, in which the listed reference was cited.

* cited by examiner

*Primary Examiner* — Derris H Banks
*Assistant Examiner* — Tai Nguyen
(74) *Attorney, Agent, or Firm* — J.C. Patents

(57) ABSTRACT

A method for fabricating a blind via structure of a substrate is provided. First, a substrate is provided, which includes a conductive layer, a metal layer, and a dielectric layer disposed between the conductive layer and the metal layer. Next, a cover layer is formed on the conductive layer. Finally, the substrate formed with the cover layer is irradiated by a laser beam to form at least one blind via structure extending from the cover layer to the metal layer. The blind via structure includes a first opening, a second opening, and a third opening linking to one another. The first opening passes through the cover layer. The second opening passes through the conductive layer. The third opening passes through the dielectric layer. For example, a size of the first opening is greater than a size of the second opening and a size of the third opening.

11 Claims, 5 Drawing Sheets

METHOD FOR FABRICATING BLIND VIA STRUCTURE OF SUBSTRATE

CROSS-REFERENCE TO RELATED APPLICATION

This application claims the priority benefit of Taiwan application serial no. 97130098, filed on Aug. 7, 2008. The entirety of the above-mentioned patent application is hereby incorporated by reference herein and made a part of specification.

BACKGROUND OF THE INVENTION

1. Field of the Invention

The present invention generally relates to a method for fabricating a substrate, in particular, to a method for fabricating a blind via structure of a substrate.

2. Description of Related Art

Currently, in the field of circuit board technology, a multi-layer circuit board usually has a plurality of conductive blind via structures. Through the conductive blind via structures, multiple layers of circuits in the multi-layer circuit board may be electrically connected between neighboring layers. In order to meet the recent developing trend of circuit boards that a line width and a line pitch are reduced and a line density is increased, the conductive blind via structures are usually formed through a laser drilling process.

FIGS. 1A to 1E are schematic cross-sectional views of a flow of a conventional laser drilling process. Referring to FIG. 1A, first, a circuit layer 11 is formed on a circuit board 10. Next, referring to FIG. 1B, an insulating layer 12 is formed on the circuit layer 11 and a copper foil layer 13 is formed on the insulating layer 12, in which the insulating layer 12 covers the circuit layer 11 and a portion of the circuit board 10. Next, referring to FIG. 1C, a surface uniform etching process (SUEP) is performed on the copper foil layer 13, so as to form a thinned copper foil layer 13'. Next, referring to FIG. 1D, a rough oxide layer 14 is formed on the thinned copper foil layer 13', in which the rough oxide layer 14 is made of, for example, copper oxide. Then, referring to FIG. 1E, a laser beam L is irradiated, so as to form a blind via 20 passing through the rough oxide layer 14, the copper foil layer 13', and the insulating layer 12 and linking to the circuit layer 11. Thus, the laser drilling process of the blind via 20 is finished.

After the blind via 20 has been formed, the melting copper may be splashed in the region ablated by the laser, so as to contaminate the via wall, such that it is necessary to clean up the melted copper splashed on the via wall by using an etching process, thereby preventing the via wall from being contaminated to affect the subsequent process. However, the rough oxide layer 14 cannot resist an etchant used in the etching process. That is to say, the rough oxide layer 14 may be corroded by the etchant. When the rough oxide layer 14 is corroded through by the etchant, the copper foil layer 13', the insulating layer 12, and the circuit layer 11 located under the rough oxide layer 14 may also be corroded by the etchant, thereby affecting the stability of the subsequent process.

In addition, in the flow of the conventional laser drilling process, before forming the rough oxide layer 14, a surface lithographing and etching process is performed on the copper foil layer 13, so as to form the thinned copper foil layer 13', in which a thickness uniformity of the thinned copper foil layer 13' may be affected by a surface cleanness of the copper foil layer 13 and a tumbling efficiency of the etchant on the surface of the copper foil layer 13 during the lithographing and etching process. Furthermore, when the rough oxide layer 14 is formed on the surface of the thinned copper foil layer 13', a portion of copper may be oxidized to form copper oxide. In other words, the thickness uniformity of the thinned copper foil layer 13' may be unstable due to the fabricating process, which may directly or indirectly affect the quality of the subsequent process for forming the via by using laser.

SUMMARY OF THE INVENTION

Accordingly, the present invention is directed to a method for fabricating a blind via structure of a substrate, which simplifies a production flow to improve stability of the process.

As embodied and broadly described herein, the present invention provides a method for fabricating a blind via structure of a substrate. First, a substrate is provided, which includes a conductive layer, a metal layer, and a dielectric layer disposed between the conductive layer and the metal layer. Next, a cover layer is formed on the conductive layer. Finally, the substrate formed with the cover layer is irradiated by a laser beam to form at least one blind via structure extending from the cover layer to the metal layer. The blind via structure includes a first opening, a second opening, and a third opening linking to one another. The first opening passes through the cover layer. The second opening passes through the conductive layer. The third opening passes through the dielectric layer. In an embodiment of the present invention, a size of the first opening is greater than a size of the second opening and a size of the third opening.

In an embodiment of the present invention, the conductive layer is made of copper.

In an embodiment of the present invention, the metal layer is made of the same material as the conductive layer.

In an embodiment of the present invention, the cover layer is made of a photosensitive material.

In an embodiment of the present invention, the photosensitive material includes an organic material with an azo functional group.

In an embodiment of the present invention, after forming the blind via structure, the method further includes removing the cover layer.

In an embodiment of the present invention, before the step of removing the cover layer, the method further includes etching the conductive layer exposed out of the first opening by using the cover layer as an etching mask.

In an embodiment of the present invention, after removing the cover layer, the method further includes filling a conductive material in the second opening and the third opening of the blind via structure, so as to form a conductive blind via structure.

In an embodiment of the present invention, a manner of filling the conductive material includes electroplating or screen printing the conductive material.

In an embodiment of the present invention, the screen printing filled conductive material is any one selected from a group consisting of a copper paste, a silver paste, a copper colloid, a silver colloid, a conductive polymer, or a combination thereof.

To sum up, in the present invention, the cover layer and the conductive layer are directly heated by the laser beam, such that the cover layer and the conductive layer are ablated to respectively form openings with different apertures, and meanwhile, the dielectric layer under the conductive layer absorbs the heat of the conductive layer and is vaporized. In this manner, in the present invention, the blind via structure is formed merely by performing the laser processing once. In addition, the cover layer of the present invention is made of a photosensitive material. As compared with the conventional art, the cover layer of the present invention is protected from being corroded by the etchant, which can protect the structures located there below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
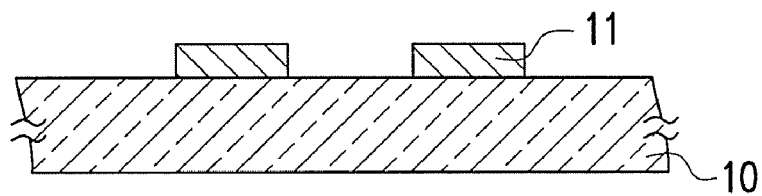
FIGS. 1A to 1E are schematic cross-sectional views of a flow of a conventional laser drilling process.
Figure 1B:
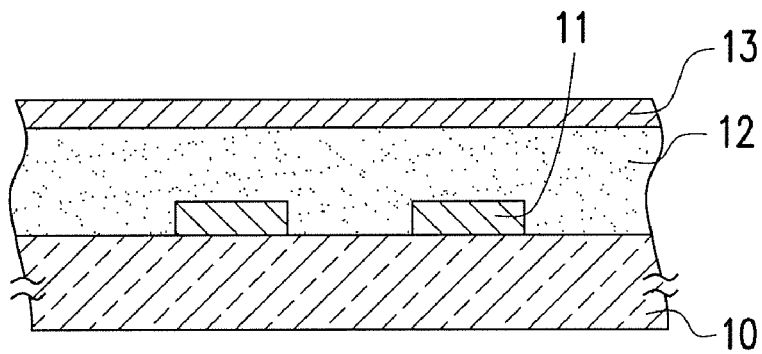
Figure 1C:
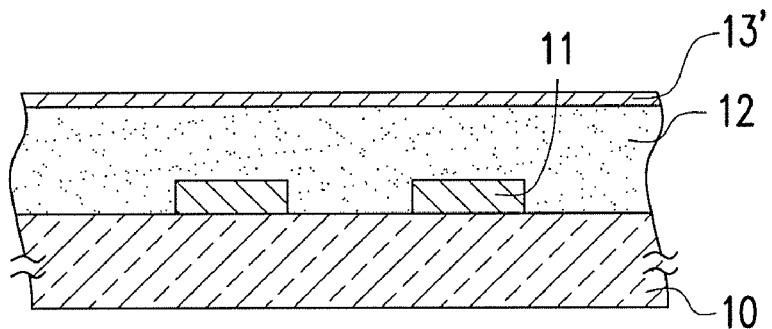
Figure 1D:
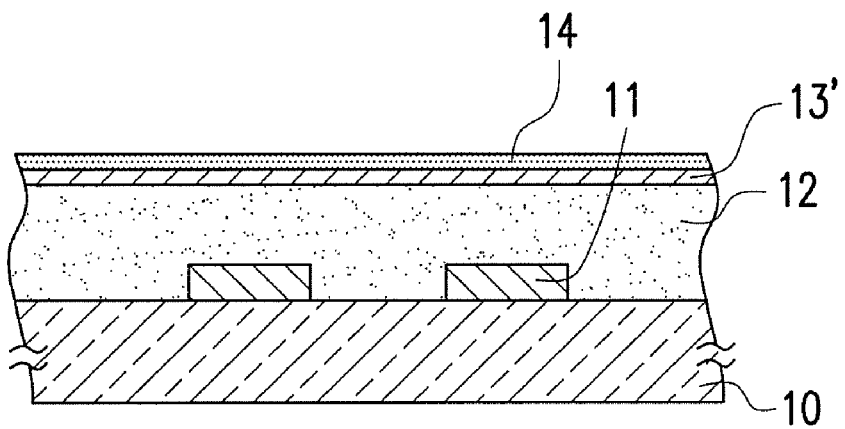
Figure 1E:
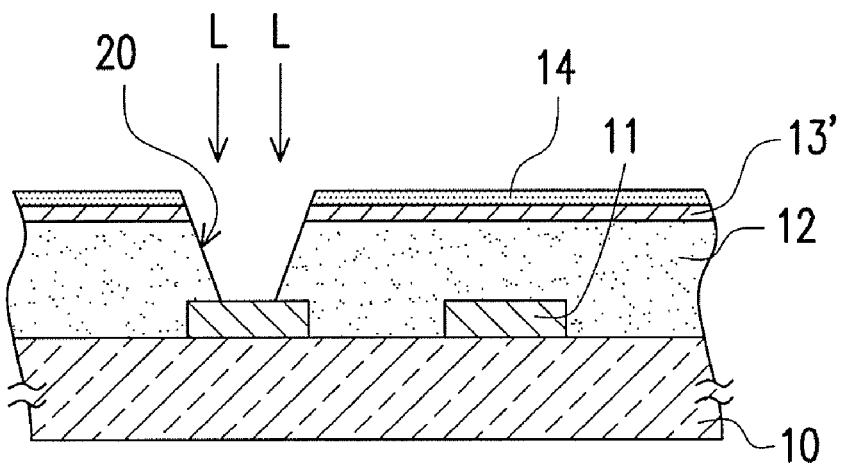

Reference will now be made in detail to the present embodiments of the invention, examples of which are illustrated in the accompanying drawings. Wherever possible, the same reference numbers are used in the drawings and the description to refer to the same or like parts.

Figure 2A:
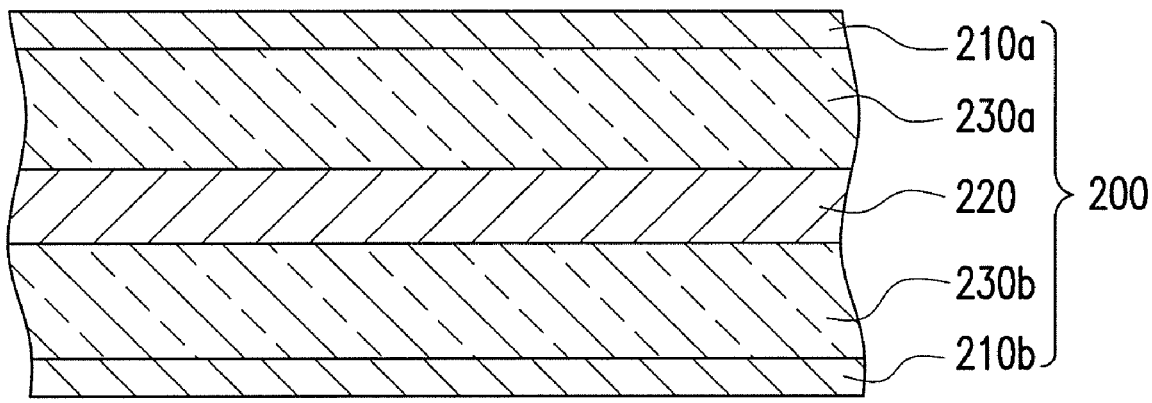
FIGS. 2A to 2E show a method for fabricating a blind via structure of a substrate according to an embodiment of the present invention.

FIGS. 2A to 2E show a method for fabricating a blind via structure of a substrate according to an embodiment of the present invention. Referring to FIG. 2A, in the method for fabricating the blind via structure of the substrate according to this embodiment, first, a substrate 200 is provided. The substrate 200 includes a metal layer 220, two conductive layers 210a and 210b respectively located above the metal layer 220, and two dielectric layers 230a and 230b respectively disposed between the conductive layers 210a and 210b and the metal layer 220.

In this embodiment, the substrate 200 may be a copper clad laminate (CCL) substrate, a substrate combined by multiple copper foil layers, or another substrate capable of being used to manufacture a circuit board. The conductive layers 210a and 210b and the metal layer 220 are made of, for example, copper or other appropriate metal materials. The dielectric layers 230a and 230b are, for example, c-stage prepreg films, or the dielectric layers 230a and 230b are respectively bonded between the metal layer 220 and the conductive layers 210a and 210b by heating and curing a b-stage prepreg film. In this embodiment, although the substrate 200 with the conductive layers 210a and 210b on double sides thereof is set as an example, it is not limited here. In another embodiment, the substrate 200 may also be formed by a conductive layer 210a on a single surface thereof, a metal layer 220, and a dielectric layer 230a located between the conductive layer 210a and the metal layer 220.

Figure 2B:
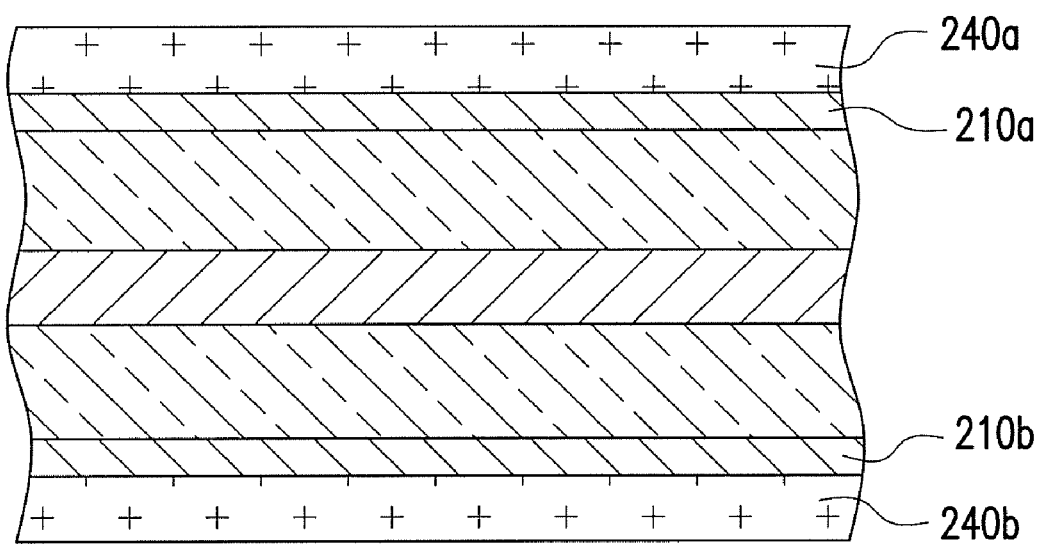

Referring to FIG. 2B, two cover layers 240a and 240b are respectively formed on the conductive layers 210a and 210b. The cover layers 240a and 240b are, for example, formed on the conductive layers 210a and 210b through a spin-coating or a printing manner, in which the cover layers 240a and 240b are made of, for example, a wet photosensitive material. In addition, in other embodiments (not shown), the cover layers may be formed on the conductive layers through a laminating manner or an adhering manner, in which the cover layers are made of, for example, a dry photosensitive material, in which the photosensitive material is for example, an organic material with an azo functional group.

Figure 2C:
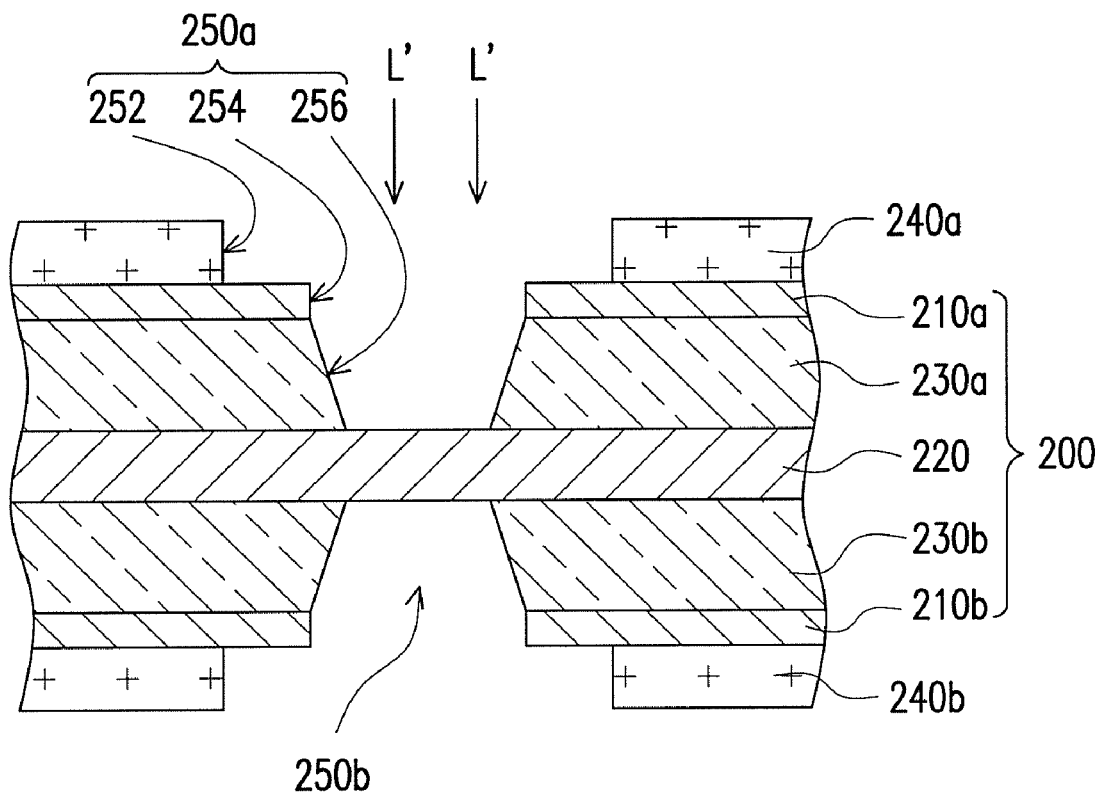

Referring to FIG. 2C, the substrate 200 formed with the cover layers 240a and 240b are irradiated by a laser beam L', so as to form two blind via structures 250a and 250b extending from the cover layers 240a and 240b to the metal layer 220, and the laser beam L' may be a carbon dioxide laser or may be provided by another appropriate laser table.

In this embodiment, the cover layer 240a, the conductive layer 210a, and the dielectric layer 230a are respectively symmetrical to the cover layer 240b, the conductive layer 210b, and the dielectric layer 230b of the substrate 200 with respect to the metal layer 220, so that when the laser beam L' is irradiated on the cover layers 240a and 240b to form the blind via structures 250a and 250b respectively, the configuration of the blind via structure 250a is substantially the same as that of the blind via structure 250b.

In the following, for the convenience of description, the blind via structure 250a is set as an example for description. In detail, the blind via structure 250a includes a first opening 252, a second opening 254, and a third opening 256 linking to one another, in which the first opening 252 passes through the cover layer 240a, the second opening 254 passes through the conductive layer 210a, and the third opening 256 passes through the dielectric layer 230a. For example, a size of the first opening 252 is greater than a size of the second opening 254 and a size of the third opening 256.

After the cover layer 240a and the conductive layer 210a absorb the energy of the laser beam, since the cover layer 240a and the conductive layer 210a are made of different materials, the ablating speeds of the laser beam L' on the cover layer 240a and the conductive layer 210a are different. As a result, the first opening 252 and the second opening 254 with different sizes are generated in the cover layer 240a and the conductive layer 210a. Meanwhile, after absorbing the fluence of the laser beam, the conductive layer 210a generates high heats partially, such that the dielectric layer 230a under the conductive layer 210a absorbs the heats of the conductive layer 210a and is vaporized, thereby generating the third opening 256.

In other words, when the energy of the laser beam L' is appropriately controlled and the laser beam L' is irradiated on the cover layer 240a and the conductive layer 210a, it is possible to obtain the blind via structure 250a with the size of the first opening 252 greater than the size of the second opening 254 and the size of the third opening 256, without conformal mask, or exposing and developing a photoresistive opening, or other pre-processing steps, thereby simplifying the laser processing steps.

Figure 2D:
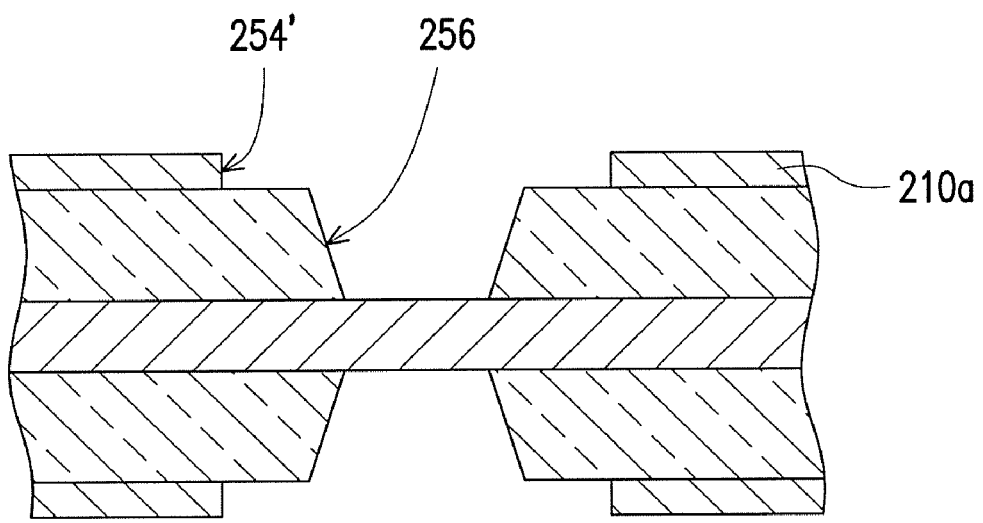

Referring to FIGS. 2C and 2D, after the blind via structure 250a is formed, resin smear may be generated in the region ablated by the laser, or particles (for example, melted copper) may be left on the conductive layer 210a located under the first opening 252, such that before the cover layer 240a is removed, a de-smearing process, an etching process, a melted copper removing process, or other surface processing operations may be selectively performed. For example, in FIGS. 2C and 2D, the conductive layer 210a exposed out of the first opening 252 is wholly etched by using the cover layer 240a as an etching mask. Next, the cover layer 240a is removed, such that the conductive layer 210a originally covered by the cover layer 240a is exposed. In addition, in another embodiment, it is also possible to merely clean up the resin smear or the residual particles on the conductive layer 210a, and keep the conductive layer 210a without residuals under the first opening 252.

In detail, the conductive layer 210a exposed out of the first opening 252 is etched by using the cover layer 240a as the etching mask, and thus, after the etching process, the second opening 254 originally passing through the conductive layer 210a may form a second opening 254' with a size greater than that of the former second opening 254.

It should be noted that, when the etching process is performed by using the cover layer 240a as the etching mask, the metal layer 220 may be used as a barrier layer, so as to provide an etching barrier effect, thereby preventing the etching process from expanding towards the dielectric layer 230b.

Figure 2E:
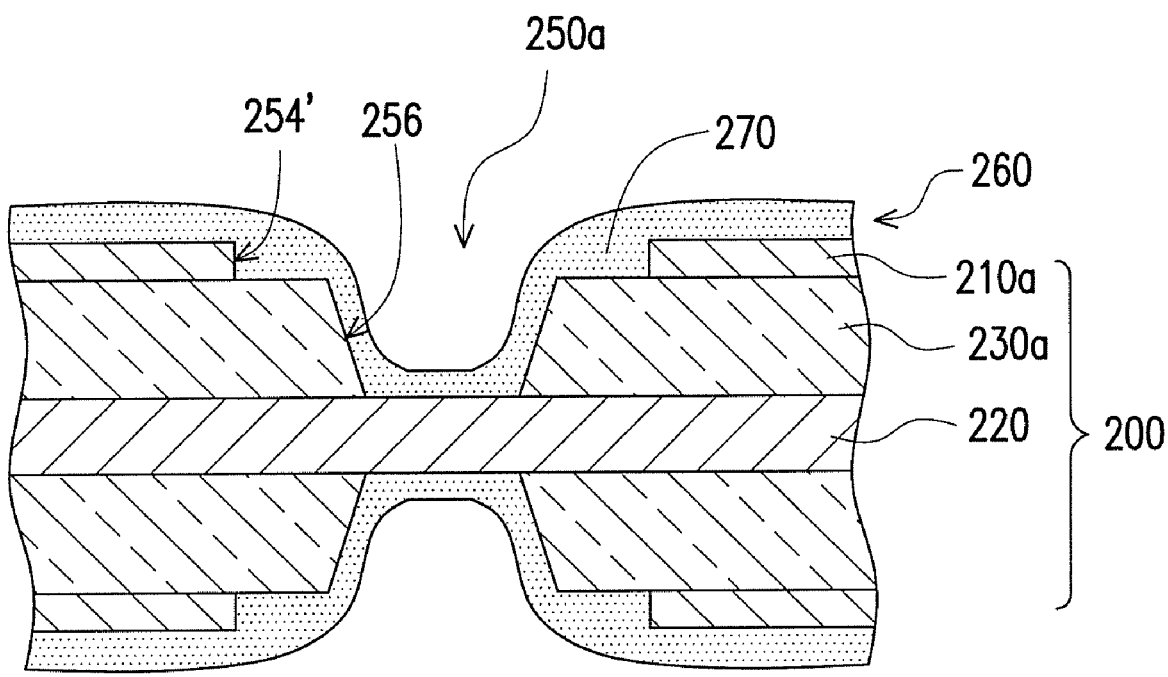

Referring to FIG. 2E, finally, a conductive material 260 is filled in the second opening 254' and the third opening 256 of the blind via structure 250a, so as to form a conductive blind via structure 270. In detail, the conductive material 260 covers the via wall of the blind via structure 250a, that is to say, the conductive material 260 covers the conductive layer 210a, the dielectric layer 230a, and a portion of the metal layer 220. In this embodiment, the manner of filling the conductive material 260 is, for example, electroplating, and the conductive material 260 is, for example, copper.

It should be noted that, although the conductive blind via structure 270 shown in FIG. 2E only covers the via wall of the blind via structure 250a and does not fill up the blind via structure 250a, in other embodiments (not shown), the conductive blind via structure 270 may also fill up the whole blind via structure 250a. Therefore, the conductive blind via structure 270 shown in FIG. 2E is only intended for demonstration, but not used to limit the present invention.

It should be noted that, the substrate 200 as shown in FIG. 2E is a double sided circuit board, but this embodiment may be applied to manufacture a multi-layer substrate with three or more than three layers of circuits, and those skilled in the art can easily understand how to apply the method for forming the blind via structure of the structure by using laser in this embodiment to the manufacturing of the multi-layer substrate with three or more than three layers of circuits according to FIGS. 2A to 2E and the above descriptions. Therefore, it is emphasized herein that, FIGS. 2A to 2E are only used for exemplary descriptions, but not to limit the present invention.

To sum up, in the present invention, the cover layer and the conductive layer are directly heated by the laser beam, such that the cover layer and the conductive layer are ablated to respectively form openings with different sizes, and meanwhile, the dielectric layer under the conductive layer absorbs the heat of the conductive layer and is vaporized. In this manner, in the present invention, the blind via structure is formed merely by performing the laser processing once. In addition, the cover layer of the present invention can protect the conductive layer, the dielectric layer, and the metal layer located there below from being corroded by the etchant.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating a blind via structure of a substrate, comprising:
    providing a substrate, comprising a conductive layer, a metal layer, and a dielectric layer disposed between the conductive layer and the metal layer;
    forming a cover layer on the conductive layer; and
    irradiating a laser beam on the substrate formed with the cover layer, so as to form at least one blind via structure extending from the cover layer to the metal layer, wherein the blind via structure comprises a first opening, a second opening, and a third opening linking to one another, the first opening passes through the cover layer, the second opening passes through the conductive layer, the third opening passes through the dielectric layer.

2. The method for fabricating a blind via structure of a substrate according to claim 1, wherein a size of the first opening is greater than a size of the second opening and a size of the third opening.

3. The method for fabricating a blind via structure of a substrate according to claim 1, wherein the conductive layer is made of copper.

4. The method for fabricating a blind via structure of a substrate according to claim 1, wherein the metal layer is made of the same material as the conductive layer.

5. The method for fabricating a blind via structure of a substrate according to claim 1, wherein the cover layer is made of a photosensitive material.

6. The method for fabricating a blind via structure of a substrate according to claim 5, wherein the photosensitive material comprises an organic material with an azo functional group.

7. The method for fabricating a blind via structure of a substrate according to claim 1, wherein after forming the blind via structure, the method further comprises removing the cover layer.

8. The method for fabricating a blind via structure of a substrate according to claim 7, wherein before the step of removing the cover layer, the method further comprises:
    etching the conductive layer exposed out of the first opening by using the cover layer as an etching mask.

9. The method for fabricating a blind via structure of a substrate according to claim 7, wherein after removing the cover layer, the method further comprises filling a conductive material in the second opening and the third opening of the blind via structure, so as to form a conductive blind via structure.

10. The method for fabricating a blind via structure of a substrate according to claim 9, wherein a manner for filling the conductive material comprises electroplating or screen printing the conductive material.

11. The method for fabricating a blind via structure of a substrate according to claim 10, wherein the conductive material is selected from a group consisting of a copper paste, a silver paste, a copper colloid, a silver colloid and a conductive polymer.

* * * * *